United States Patent
Nakaya et al.

(10) Patent No.: US 6,359,384 B1
(45) Date of Patent: *Mar. 19, 2002

(54) ORGANIC ELECTROLUMINESCENT DEVICE WITH ELECTRON INJECTING ELECTRODE CONTAINING ALLI ALLOY

(75) Inventors: Kenji Nakaya; Isamu Kobori, both of Chiba; Masami Mori, Yamanashi; Kazutoshi Ohisa, Ibaraki; Michio Arai, Tokyo, all of (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/117,144
(22) PCT Filed: Nov. 26, 1997
(86) PCT No.: PCT/JP97/04310
  § 371 Date: Jul. 24, 1998
  § 102(e) Date: Jul. 24, 1998
(87) PCT Pub. No.: WO98/24272
  PCT Pub. Date: Jun. 4, 1998

(30) Foreign Application Priority Data

Nov. 27, 1996 (JP) .............................. 8-331632
Apr. 25, 1997 (JP) .............................. 9-123220

(51) Int. Cl.$^7$ .............................. H05B 33/26
(52) U.S. Cl. .................. 313/504; 313/506; 427/66
(58) Field of Search ................ 313/504, 506, 313/503; 428/690, 917; 427/66

(56) References Cited

U.S. PATENT DOCUMENTS

| | | | |
|---|---|---|---|
| 5,429,884 A | * 7/1995 | Namiki et al. | 428/690 |
| 5,981,092 A | * 11/1999 | Arai et al. | 428/690 |
| 5,998,803 A | * 12/1999 | Forrest et al. | 257/40 |
| 6,010,796 A | * 1/2000 | Kajima | 428/690 |
| 6,172,458 B1 | * 1/2001 | Nakaya et al. | 313/504 |

FOREIGN PATENT DOCUMENTS

| | | |
|---|---|---|
| JP | 60-165771 | 8/1985 |
| JP | 4-212287 | 8/1992 |
| JP | 4-363896 | 12/1992 |
| JP | 5-121172 | 5/1993 |
| JP | 5-159882 | 6/1993 |
| JP | 8-31573 | 2/1996 |

* cited by examiner

*Primary Examiner*—Nimeshkumar D. Patel
*Assistant Examiner*—Karabi Guharay
(74) *Attorney, Agent, or Firm*—Oblon, Spivak, McClelland, Maier & Neustadt, P.C.

(57) ABSTRACT

The invention provides an organic EL device comprising a hole injecting electrode, and at least one organic layer disposed between the electrodes, wherein the electron injecting electrode is comprised of an AlLi alloy containing 0.4–14 at % of lithium deposited by a sputtering process. This improves the film formability and adhesion at the interface between the electron injecting electrode and the organic layer, realizing an organic EL device featuring a high luminance, high efficiency, long lifetime, and high display quality.

18 Claims, 1 Drawing Sheet

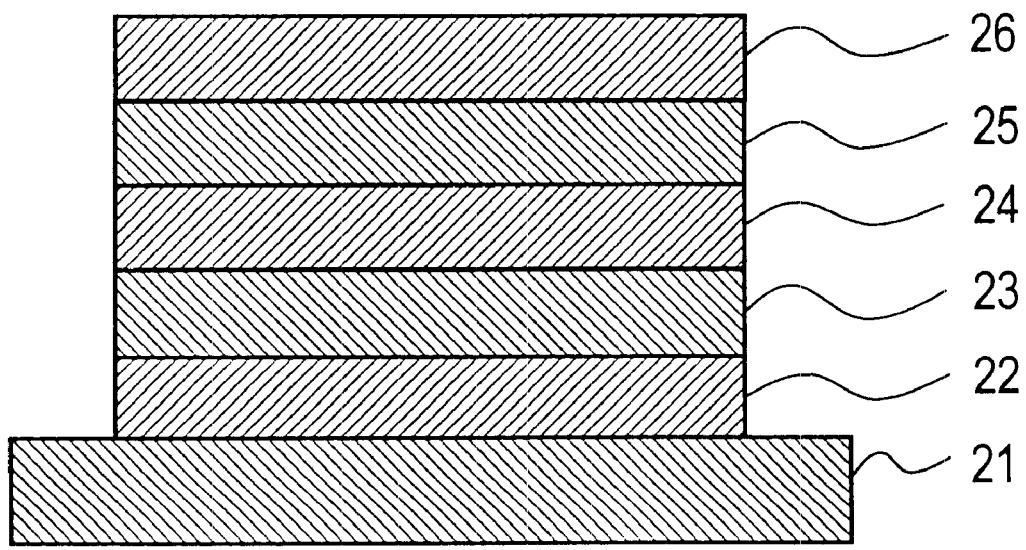

ORGANIC ELECTROLUMINESCENT DEVICE WITH ELECTRON INJECTING ELECTRODE CONTAINING ALLI ALLOY

TECHNICAL FIELD

This invention relates to an organic electroluminescent (EL) device using an organic compound and a method for preparing the same, and more particularly, to an electron injecting electrode and a method for preparing the same.

BACKGROUND ART

Recently, active research works have been made on organic EL devices. As a basic configuration, the organic EL device includes a transparent electrode or hole injecting electrode of tin-doped indium oxide (ITO) etc., a thin film formed thereon by evaporating a hole transporting material such as triphenyldiamine (TPD), a light emitting layer deposited thereon of a fluorescent material such as an aluminum quinolinol complex (Alq3), and a metal electrode or electron injecting electrode formed thereon from a metal having a low work function such as magnesium. Such organic EL devices are attractive in that they can achieve a very high luminance ranging from several 100 to several 10,000 cd/m$^2$ with a drive voltage of approximately 10 volts.

With respect to the material used as the electron injecting electrode of such organic EL devices, a material capable of injecting more electrons into the light emitting layer or the electron injecting and transporting layer is believed effective. Differently stated, a material having a lower work function is believed suitable as the electron injecting electrode. There are known many materials having a low work function. For use as the electron injecting electrode of organic EL devices, JP-A 15595/1990, for example, discloses electron injecting electrodes constructed of plural metals other than alkali metals wherein at least one of the metals has a work function of less than 4 eV, such as MgAg.

Alkali metals are preferred materials having a low work function. U.S. Pat. Nos. 3,173,050 and 3,382,394 describe Na and K as exemplary alkali metals. Since electrodes using alkali metals, however, are highly active and chemically unstable, they are inferior in safety and reliability to electron injecting electrodes using MgAg or the like.

Known attempts to enhance the stability of electron injecting electrodes using alkali metals include the electron injecting electrodes of AlLi alloys described in JP-A 165771/1985, 212287/1992, 121172/1993, and 159882/1993, for example. Reference is made to the lithium concentration and preparation of the AlLi alloys described in these patent publications. (1) JP-A 165771/1985 discloses a lithium concentration of 3.6 to 99.8 at % (1 to 99 wt %), preferably 29.5 to 79.1 at % (10 to 50 wt %), with AlLi alloys containing 15.8 to 79.1 at % (4.8 to 50 wt %) of lithium being described in Examples. All these AlLi alloys were deposited by an evaporation process. (2) JP-A 212287/1992 describes a lithium concentration of at least 6 at %, preferably 6 to 30 at %, with an AlLi alloy containing 28 at % of lithium being described in Example. It is also described that these AlLi alloys can be deposited as films by resistive heating co-evaporation, electron beam evaporation and sputtering, although only the evaporation process is used in Examples. (3) JP-A 121172/1993 discloses a lithium concentration of 0.0377 to 0.38 at % (0.01 to 0.1:100 weight ratio), while AlLi alloys containing 0.060 to 0.31 at % (0.016 to 0.08:100 weight ratio) of lithium are formed by resistive heating evaporation or electron beam evaporation in Examples. It is described that the preferred concentration is up to 15.9 at % (up to 50:1000 weight ratio), while AlLi alloys containing 29.5 to 61.8 at % (10 to 30 wt %) of lithium are formed as films in Examples. (4) JP-A 159882/1993 discloses a lithium concentration of 5 to 90 at % and describes in Examples that AlLi alloys having a lithium concentration of 16 to 60 at % are formed into films by a two-source evaporation process using resistive heating evaporation for the lithium source and electron beam evaporation for the other source.

However, the AlLi alloy electrodes of (1), (3) and (4) described above are formed into films solely by vacuum evaporation. As to the AlLi alloy electrode of (2), a sputtering process is referred to, but a vacuum evaporation process is used in Examples and no exemplary sputtering process is described.

Where the vacuum evaporation process is used, an AlLi alloy is used as the lithium evaporation source since lithium alone is inferior in chemical stability, film formability and adhesion. However, because of different vapor pressures of the two metals; two-source evaporation or co-evaporation along with aluminum is necessary. The two-source evaporation is not easy to control the composition of a deposit and difficult to consistently provide an optimum composition in every run. As a consequence, the lithium concentration of actual deposits is biased to a relatively high concentration range of 16 to 79 at % and remains inconsistent. Higher lithium concentrations entail chemical instability and eventually, cause to exacerbate the film formability and adhesion of deposits, deteriorating device characteristics. The deposits are inconsistent in quality too. Conversely, if evaporation is carried out from a single evaporation source, the lithium concentration becomes as low as 0.38 at % or less. Such alloys have a high work function and hence, a low efficiency of electron injection, making it difficult to produce devices having practically acceptable characteristics.

Also, the electron injecting electrodes formed by the vacuum evaporation process are less dense as a film and less adhesive to the organic layer at the interface, which cause to exacerbate the performance, lifetime and display quality of EL devices by way of a drop of light emission efficiency, peeling of the electrode and the concomitant development of dark spots.

Further, since lithium or a similar material having a low work function is highly reactive to oxygen and moisture and the steps of feeding and supplementing the material are generally carried out in the air, oxide forms on the material surface. To form electron injecting electrodes of quality, it is preferred to remove the oxide coating prior to evaporation. Removal of the oxide coating is difficult since it seldom occurs that the oxide has a lower evaporation temperature or a higher vapor pressure than the elemental metal. It is thus not easy to form a high quality electron injecting electrode in the form of a pure metal film. Furthermore, if an evaporated film of such an oxide is formed at the interface between the electron injecting electrode and the organic layer or within the electron injecting electrode, desired EL characteristics are not obtainable because the resulting electrode has a different work function and electric conductivity from those of the elemental metal. Further, many problems concerning productivity arise from the practical point of view; for example, there arise problems with respect to composition control and the uniformity of film thickness and quality if exchange or supplement of the material to be evaporated becomes necessary within a short period or the deposition area is increased; and there arise problems with respect to composition control and the reproducibility and uniformity of film quality if the rate of deposition is increased.

DISCLOSURE OF THE INVENTION

An object of the invention is to realize an organic EL device featuring a high luminance, high efficiency, long lifetime, and high display quality, by improving the film formability and adhesion at the interface between an electron injecting electrode and an organic layer.

This and other objects are achieved by the construction defined below as (1) to (4).

(1) An organic electroluminescent device comprising a hole injecting electrode, an electron injecting electrode, and at least one organic layer disposed between the electrodes, said electron injecting electrode being comprised of an AlLi alloy containing 0.4 to 14 at % of lithium deposited by a sputtering process.

(2) A method for preparing an organic electroluminescent device, wherein an electron injecting electrode as set forth in (1) is deposited by a sputtering process using an AlLi alloy as the target.

(3) A method for preparing an organic electroluminescent device according to (2) wherein the sputtering process involves changing the pressure of film forming gas in the range of 0.1 to 5 Pa for changing the concentration of lithium in the electron injecting electrode being deposited in the range of 0.4 to 14 at %.

(4) A method for preparing an organic electroluminescent device according to (2) wherein the sputtering process is a DC sputtering process.

BRIEF DESCRIPTION OF THE DRAWINGS

FIG. 1 is a schematic view illustrating one exemplary construction of an organic EL device.

BEST MODE FOR CARRYING OUT THE INVENTION

Now the illustrative construction of the invention is described in detail.

The organic EL device of the invention includes a hole injecting electrode, an electron injecting electrode, and at least one organic layer disposed between the electrodes, wherein the electron injecting electrode is comprised of an AlLi alloy containing 0.4 to 14 at % of lithium deposited by a sputtering process.

The use of the sputtering process has several advantages. The electron injecting electrode film formed by the sputtering process is improved in adhesion at the interface with the organic layer because as compared with the evaporation process, the sputtered atoms and atomic groups acquire relatively high kinetic energy so that the migration effect may occur. Also, since the surface oxide layer can be removed in vacuum by effecting pre-sputtering or the moisture and oxygen which have adsorbed on the organic layer interface can be removed by effecting back sputtering, it is possible to form a clean electrode-organic layer interface and a clean electrode and eventually, to fabricate an organic EL device of quality and stable performance. Further, even when a mixture of materials having significantly different vapor pressures is used as the target, there occurs only a slight shift in composition between the target and the film deposited therefrom, which eliminates the limits that are imposed on the materials by the vapor pressure or the like in the case of the evaporation process. The sputtering process is also advantageous in productivity as compared with the evaporation process because it is unnecessary to supply the material for a long period of time and the resulting film is well uniform in thickness and quality.

Since the electron injecting electrode formed by the sputtering process is a dense film which minimizes the ingress of moisture as compared with an evaporated film of sparse packing, there can be obtained an organic EL device having high chemical stability and a long lifetime.

The AlLi alloy of which the electron injecting electrode is made has a lithium content of 0.4 to 14 at %, preferably from 0.4 to 6.5 at % (exclusive of 6.5), more preferably from 0.4 to 5 at % (exclusive of 5), further preferably 0.4 to 4.5 at %, still further preferably 0.4 to 4 at %, especially 0.4 to 3 at %, or preferably from 6.5 to 14 at %, more preferably from 7 to 12 at %. With too high lithium contents, the electron injecting electrodes deposited become less stable. With too low lithium contents, the benefits of the invention are lost. Also, a higher lithium concentration setting is preferable in order to enhance the stability of light emission luminance, whereas a lower lithium concentration setting is preferable in order to enhance the stability of drive voltage.

Also, a lithium content of 0.8 to 12 at % is preferred. A lithium content of 0.8 to 2.8 at %, especially 1.5 to 2.5 at % is preferable from the standpoint of the stability of drive voltage, that is, voltage rise. A lithium content of 3.2 to 12 at % is preferable from the standpoint of luminance. From the standpoints of increasing the luminance and suppressing the drive voltage and voltage rise, a lithium content of 3.5 to 10 at %, especially 3.5 to 9 at % is preferable.

In addition to aluminum and lithium, the alloy may contain at least one of Cu, Mg, Zr, Fe, Si, O, etc. each in an amount of up to 5 wt % as an additive or incidental component.

The electron injecting electrode formed may have a graded structure that the lithium concentration varies in a film thickness direction such that it is lithium element rich near its interface with the organic layer, but aluminum element rich near the opposite surface. Such a concentration gradation ensures that lithium element having a low work function is present in a higher concentration at the organic layer interface requiring an electron injecting function and lithium element having high reactivity is present in a lower concentration at the opposite surface where contact with the ambient air can frequently occur, succeeding in realizing an electron injecting electrode which is improved in stability while maintaining a high efficiency of electron injection.

The electron injecting electrode can be given a graded concentration of lithium element, in one preferred embodiment, readily by controlling the sputtering pressure as will be described later, or otherwise, for example, by using an AlLi alloy sputtering target and an aluminum metal target at the same time and individually controlling the rates of deposition thereof. Apart from imparting the continuously graded concentration, it is also acceptable to form a film in which the mix ratio of lithium element varies discontinuously or stepwise.

The pressure of the sputtering gas during sputtering is preferably in the range of 0.1 to 5 Pa. By controlling the pressure of the sputtering gas within this range, an AlLi alloy having a lithium concentration within the above-defined range can be easily obtained. Also, by changing the pressure of the sputtering gas within this range during film deposition, an electron injecting electrode having a graded lithium concentration as described above can be easily obtained.

The sputtering gas may be an inert gas as used in conventional sputtering apparatus, and in the case of reactive sputtering, a reactive gas such as $N_2$, $H_2$, $O_2$, $C_2H_4$ and $NH_3$ may be used in addition to the inert gas.

The sputtering process may be a high-frequency sputtering process using an RF power supply although a DC sputtering process, especially a pulse DC sputtering process is preferably used because the rate of film deposition is easily controllable and for the purpose of minimizing the damage to the organic EL device structure. The power to the DC sputtering apparatus is preferably in the range of 0.1 to 10 W/cm$^2$, especially 0.5 to 7 W/cm$^2$. Also, the rate of film deposition is preferably in the range of 0.1 to 100 nm/min., especially 1 to 30 nm/min.

The electron injecting electrode thin film may have a thickness equal to or in excess of a certain level necessary to carry out electron injection, typically at least 1 nm, preferably at least 3 nm. The upper limit of thickness is not critical although the film thickness generally ranges from about 3 nm to about 500 nm.

On the organic EL device of the invention, at least one of oxides, nitrides and carbides of the material of which the electron injecting electrode is made may be provided as a protective film utilizing reactive sputtering as mentioned above. In this case, the starting material from which the protective film is formed may be of the same composition as the electron injecting electrode-forming material although a material having a different compositional proportion or a material of the same composition except for the omission of one or more components may also be used. Using the same material as the electron injecting electrode or a similar material, the protective film can be formed contiguous to the electron injecting electrode.

The oxygen content in the oxide, the nitrogen content in the nitride or the carbon content in the carbide may deviate from its stoichiometry as long as the content is within the range of 0.5 to 2 times the stoichiometric content.

As the target, the same material as the electron injecting electrode is preferably used. As the reactive gas, mention may be made of $O_2$ and CO when the oxide is to be formed, $N_2$, $NH_3$, NO, $NO_2$, and $N_2O$ when the nitride is to be formed, and $CH_4$, $C_2H_2$, and $C_2H_4$ when the carbide is to be formed. These reactive gases may be used alone or in admixture of two or more.

The protective film may have a thickness equal to or in excess of a certain level necessary to prevent the ingress of moisture, oxygen or organic solvent, preferably at least 50 nm, more preferably at least 100 nm, most preferably in the range of 100 to 1,000 nm.

The total thickness of the electron injecting electrode and the protective film combined is not critical although it is generally about 100 to about 1,000 nm.

The provision of such a protective film is effective for further preventing the electron injecting electrode from oxidation, thereby enabling stable driving of the organic EL device for a longer period of time.

The organic EL light emitting device fabricated according to the invention has a hole injecting electrode on a substrate and an electron injecting electrode thereon. The device further includes at least one charge transporting layer and at least one light emitting layer each interleaved between the electrodes, and a protective layer as the uppermost layer. It is understood that the charge transporting layer may be omitted. The electron injecting electrode is composed of a metal, compound or alloy having a low work function and deposited by the sputtering process as previously described while the hole injecting electrode is constructed by depositing tin-doped indium oxide (ITO), zinc-doped indium oxide (IZO), ZnO, $SnO_2$, $In_2O_3$ or the like by the sputtering process.

FIG. 1 illustrates one exemplary construction of the organic EL light emitting device fabricated according to the invention. The EL device is illustrated in FIG. 1 as comprising a hole injecting electrode 22, a hole injecting and transporting layer 23, a light emitting and electron injecting and transporting layer 24, an electron injecting electrode 25, and a protective layer 26, deposited on a substrate 21 in the described order.

The organic EL device of the invention is not limited to the illustrated construction, and various other constructions are possible. For example, it is acceptable to form a light emitting layer by itself and interleave an electron injecting and transporting layer between the light emitting layer and the electron injecting electrode. If necessary, the hole injecting and transporting layer 23 may be mixed with the light emitting layer.

The electron injecting electrode is formed as previously described while organic material layers such as the light emitting layer may be formed by vacuum evaporation or the like, and the hole injecting electrode may be formed by evaporation or sputtering. If necessary, each of these films is patterned by mask evaporation or by a suitable technique such as etching after film formation whereby the desired light emitting pattern is accomplished. In a further embodiment wherein the substrate bears thin film transistors (TFT), the respective films are formed in accordance with the TFT pattern so that the display and drive pattern may be provided without further processing.

With respect to the hole injecting electrode, its material and thickness are preferably determined so that at least 80% of the emitted light may be transmitted by the electrode. Illustratively, transparent conductive oxide thin films are preferred. For example, thin films containing any one of tin-doped indium oxide (ITO), zinc-doped indium oxide (IZO), indium oxide ($In_2O_3$), tin oxide ($SnO_2$) and zinc oxide (ZnO) as the main component are useful. These oxides may deviate from their stoichiometry. ITO generally contains $In_2O_3$ and $SnO_2$ in a stoichiometric composition although the oxygen content may have some deviation therefrom. The mix proportion of $SnO_2$ relative to $In_2O_3$ is preferably 1 to 20 wt %, more preferably 5 to 12 wt %. The mix proportion of ZnO relative to $In_2O_3$ is preferably 12 to 32 wt %.

In forming the hole injecting electrode, a sputtering process is preferable. The sputtering process may be a high-frequency sputtering process using an RF power supply although a DC sputtering process, especially a pulse DC sputtering process is preferably used when the ease of control of physical properties of the film being deposited as the hole injecting electrode and the surface smoothness of the film are taken into account.

Following the electrode formation, a protective film may be formed using an organic material such as SiOx or an organic material such as Teflon. The protective film may be either transparent or opaque and have a thickness of about 50 to 1,200 nm. Apart from the reactive sputtering process mentioned above, the protective film may also be formed by an ordinary sputtering or evaporation process.

Further preferably, a sealing or encapsulating layer may be formed on the device in order to prevent the organic layers and electrodes from oxidation. The sealing layer for preventing the ingress of moisture is formed by attaching a sealing plate such as a glass plate through an adhesive resin layer such as a sheet of a commercially available low moisture pickup photo-curable adhesive, epoxy adhesive, silicone adhesive, or crosslinking ethylene-vinyl acetate copolymer adhesive. Metal plates and plastic plates are useful as well as the glass plates.

Next, the organic material layers included in the organic EL device according to the invention are described.

The light emitting layer has the functions of injecting holes and electrons, transporting them, and recombining holes and electrons to create excitons. It is preferred that relatively electronically neutral compounds be used in the light emitting layer.

The hole injecting and transporting layer has the functions of facilitating injection of holes from the hole injecting electrode, transporting holes stably, and obstructing electron transportation. The electron injecting and transporting layer has the functions of facilitating injection of electrons from the electron injecting electrode, transporting electrons stably, and obstructing hole transportation. These layers are effective for increasing the number of holes and electrons injected into the light emitting layer and confining holes and electrons therein for optimizing the recombination region to improve light emission efficiency.

The thicknesses of the light emitting layer, the hole injecting and transporting layer, and the electron injecting and transporting layer are not critical and vary with a particular formation technique although their thickness is usually preferred to range from about 5 nm to about 500 nm, especially about 10 nm to about 300 nm.

The thickness of the hole injecting and transporting layer and the electron injecting and transporting layer is equal to or ranges from about 1/10 times to about 10 times the thickness of the light emitting layer although it depends on the design of a recombination/light emitting region. When the electron or hole injecting and transporting layer is divided into an injecting layer and a transporting layer, preferably the injecting layer is at least 1 nm thick and the transporting layer is at least 1 nm. The upper limit of thickness is usually about 500 nm for the injecting layer and about 500 nm for the transporting layer. The same film thickness applies when two injecting/transporting layers are provided.

The light emitting layer of the organic EL device of the invention contains a fluorescent material that is a compound having a light emitting capability. The fluorescent material may be at least one member selected from compounds as disclosed, for example, in JP-A 264692/1988, such as quinacridone, rubrene, and styryl dyes. Also, quinoline derivatives such as metal complex dyes having 8-quinolinol or a derivative thereof as the ligand such as tris(8-quinolinolato)aluminum are included as well as tetraphenylbutadiene, anthracene, perylene, coronene, and 12-phthaloperinone derivatives. Further useful are phenylanthracene derivatives described in Japanese Patent Application No. 110569/1994 and the tetraarylethene derivatives described in Japanese Patent Application No. 114456/1994.

It is preferred to use such a compound in combination with a host material capable of light emission by itself, that is, to use the compound as a dopant. In this embodiment, the content of the compound in the light emitting layer is preferably 0.01 to 10% by weight, especially 0.1 to 5% by weight. By using the compound in combination with the host material, the light emission wavelength of the host material can be altered, allowing light emission to be shifted to a longer wavelength and improving the luminous efficacy and stability of the device.

As the host material, quinolinolato complexes are preferable, with aluminum complexes having 8-quinolinol or a derivative thereof as the ligand being more preferable.

These aluminum complexes are disclosed in JP-A 264692/1988, 255190/1991, 70733/1993, 258859/1993 and 215874/1994.

Illustrative examples include tris(8-quinolinolato)aluminum, bis(8-quinolinolato)magnesium, bis(benzo{f}-8-quinolinolato)zinc, bis(2-methyl-8-quinolinolato)aluminum oxide, tris(8-quinolinolato)indium, tris(5-methyl-8-quinolinolato)aluminum, 8-quinolinolatolithium, tris(5-chloro-8-quinolinolato)gallium, bis(5-chloro-8-quinolinolato)calcium, 5,7-dichloro-8-quinolinolatoaluminum, tris(5,7-dibromo-8-hydroxyquinolinolato)aluminum, and poly[zinc(II)-bis(8-hydroxy-5-quinolinyl)methane].

Also useful are aluminum complexes having another ligand in addition to 8-quinolinol or a derivative thereof. Examples include bis(2-methyl-8-quinolinolato)(phenolato)aluminum(III), bis(2-methyl-8-quinolinolato)(orthocresolato)aluminum(III), bis(2-methyl-8-quinolinolato)(metacresolato)aluminum(III), bis(2-methyl-8-quinolinolato)(paracresolato)aluminum(III), bis(2-methyl-8-quinolinolato)(ortho-phenylphenolato)aluminum(III), bis(2-methyl-8-quinolinolato)(meta-phenylphenolato)aluminum(III), bis(2-methyl-8-quinolinolato)(para-phenylphenolato)aluminum(III), bis(2-methyl-8-quinolinolato)(2,3-dimethylphenolato)aluminum(III), bis(2-methyl-8-quinolinolato)(2,6-dimethylphenolato)aluminum(III), bis(2-methyl-8-quinolinolato)(3,4-dimethylphenolato)aluminum(III), bis(2-methyl-8-quinolinolato)(3,5-dimethylphenolato)aluminum(III), bis(2-methyl-8-quinolinolato)(3,5-di-tert-butylphenolato)aluminum(III), bis(2-methyl-8-quinolinolato)(2,6-diphenylphenolato)aluminum(III), bis(2-methyl-8-quinolinolato)(2,4,6-triphenylphenolato)aluminum(III), bis(2-methyl-8-quinolinolato)(2,3,6-trimethylphenolato)aluminum(III), bis(2-methyl-8-quinolinolato)(2,3,5,6-tetramethylphenolato)aluminum(III), bis(2-methyl-8-quinolinolato)(1-naphtholato)aluminum(III), bis(2-methyl-8-quinolinolato)(2-naphtholato)aluminum(III), bis(2,4-dimethyl-8-quinolinolato)(ortho-phenylphenolato)aluminum(III), bis(2,4-dimethyl-8-quinolinolato)(para-phenylphenolato)aluminum(III), bis(2,4-dimethyl-8-quinolinolato)(meta-phenylphenolato)aluminum(III), bis(2,4-dimethyl-8-quinolinolato)(3,5-dimethylphenolato)aluminum(III), bis(2,4-dimethyl-8-quinolinolato)(3,5-di-tert-butylphenolato)aluminum(III), bis(2-methyl-4-ethyl-8-quinolinolato)(para-cresolato)aluminum(III), bis(2-methyl-4-methoxy-8-quinolinolato)(para-phenylphenolato)aluminum(III), bis(2-methyl-5-cyano-8-quinolinolato)(ortho-cresolato)aluminum(III), and bis(2-methyl-6-trifluoromethyl-8-quinolinolato)(2-naphtholato)aluminum(III).

Also acceptable are bis(2-methyl-8-quinolinolato)aluminum(III)-$\mu$-oxo-bis(2-methyl-8-quinolinolato)aluminum(III), bis(2,4-dimethyl-8-quinolinolato)aluminum(III)-$\mu$-oxo-bis(2,4-dimethyl-8-quinolinolato)aluminum(III), bis(4-ethyl-2-methyl-8-quinolinolato)aluminum(III)-$\mu$-oxo-bis(4-ethyl-2-methyl-8-quinolinolato)aluminum(III), bis(2-methyl-4-methoxyquinolinolato)aluminum(III)-$\mu$-oxo-bis(2-methyl-4-methoxyquinolinolato)aluminum(III), bis(5-cyano-2-methyl-8-quinolinolato)aluminum(III)-$\mu$-oxo-bis(5-cyano-2-methyl-8-quinolinolato)aluminum(III), and bis(2-methyl-5-trifluoromethyl-8-quinolinolato)aluminum(III)-$\mu$-oxo-bis(2-methyl-5-trifluoromethyl-8-quinolinolato)aluminum(III).

Other useful host materials are the phenylanthracene derivatives described in Japanese Patent Application No. 110569/1994 and the tetraarylethene derivatives described in Japanese Patent Application No. 114456/1994.

The light emitting layer may also serve as the electron injecting and transporting layer. In this case, tris(8-quinolinolato)aluminum etc. are preferably used. These fluorescent materials may be evaporated.

Also, if necessary, the light emitting layer may also be a layer of a mixture of at least one hole injecting and transporting compound and at least one electron injecting and transporting compound, in which a dopant is preferably contained. In such a mix layer, the content of the compound is preferably 0.01 to 20% by weight, especially 0.1 to 15% by weight.

In the mix layer, carrier hopping conduction paths are created, allowing carriers to move through a polarly predominant material while injection of carriers of opposite polarity is rather inhibited, and the organic compound is less susceptible to damage, resulting in the advantage of an extended device life. By incorporating the aforementioned dopant in such a mix layer, the light emission wavelength the mix layer itself possesses can be altered, allowing light emission to be shifted to a longer wavelength and improving the luminous intensity and stability of the device.

The hole injecting and transporting compound and electron injecting and transporting compound used in the mix layer may be selected from compounds for the hole injecting and transporting layer and compounds for the electron injecting and transporting layer to be described later, respectively. Inter alia, the compound for the hole injecting and transporting layer is preferably selected from amine derivatives having strong fluorescence, for example, triphenyldiamine derivatives which are hole transporting materials, styrylamine derivatives and amine derivatives having an aromatic fused ring.

The electron injecting and transporting compound is preferably selected from quinoline derivatives and metal complexes having 8-quinolinol or a derivative thereof as a ligand, especially tris(8-quinolinolato)aluminum (Alq3). The aforementioned phenylanthracene derivatives and tetraarylethene derivatives are also preferable.

The compound for the hole injecting and transporting layer is preferably selected from amine derivatives having strong fluorescence, for example, triphenyldiamine derivatives which are hole transporting materials, styrylamine derivatives and amine derivatives having an aromatic fused ring.

The mix ratio is preferably determined in accordance with the carrier density and carrier mobility. It is usually preferred that the weight ratio of the hole injecting and transporting compound to the electron injecting and transporting compound range from about 1/99 to about 99/1, more preferably from about 10/90 to about 90/10, especially from about 20/80 to about 80/20.

Also preferably, the thickness of the mix layer ranges from the thickness of a mono-molecular layer to less than the thickness of the organic compound layer, specifically from 1 to 85 nm, more preferably 5 to 60 nm, especially 5 to 50 nm.

Preferably the mix layer is formed by a co-deposition process of evaporating the compounds from distinct sources. If both the compounds have approximately equal or very close vapor pressures or evaporation temperatures, they may be pre-mixed in a common evaporation boat, from which they are evaporated together. The mix layer is preferably a uniform mixture of both the compounds although the compounds can be present in island form. The light emitting layer is generally formed to a predetermined thickness by evaporating an organic fluorescent material or coating a dispersion thereof in a resin binder.

In the hole injecting and transporting layer, there may be used various organic compounds as described, for example, in JP-A 295695/1988, 191694/1990, 792/1991, 234681/1993, 239455/1993, 299174/1993, 126225/1995, 126226/1995, and 100172/1996, and EP 0650955A1. Exemplary are tetraaryl-benzidine compounds (triaryldiamines or triphenyldiamines: TPD), aromatic tertiary amines, hydrazone derivatives, carbazole derivatives, triazole derivatives, imidazole derivatives, oxadiazole derivatives having an amino group, and polythiophenes. Two or more of these compounds may be used, and on such combined use, they may be formed as separate layers or mixed.

Where the hole injecting and transporting layer is formed separately as a hole injecting layer and a hole transporting layer, two or more compounds are selected in a proper combination from the compounds commonly used in hole injecting and transporting layers. In this regard, it is preferred to laminate layers in such an order that a layer of a compound having a lower ionization potential may be disposed adjacent the anode (ITO etc.). It is also preferred to use a compound having good thin film forming ability at the anode surface. The order of lamination also applies where a plurality of hole injecting and transporting layers are provided. Such an order of lamination is effective for lowering the drive voltage and preventing current leakage and the development and growth of dark spots. Since evaporation is utilized in the manufacture of devices, films as thin as about 1 to 10 nm can be formed uniform and pinhole-free, which restrains any change in color tone of light emission and a drop of efficiency by re-absorption even if a compound having a low ionization potential and absorption in the visible range is used in the hole injecting layer. Like the light emitting layer, the hole injecting and transporting layer may be formed by evaporating the above-mentioned compounds.

In the electron injecting and transporting layer which is optionally provided, there may be used quinoline derivatives including organic metal complexes having 8-quinolinol or a derivative thereof as a ligand such as tris(8-quinolinolato) aluminum, oxadiazole derivatives, perylene derivatives, pyridine derivatives, pyrimidine derivatives, quinoxaline derivatives, diphenylquinone derivatives, and nitro-substituted fluorene derivatives. The electron injecting and transporting layer can also serve as the light emitting layer. In this case, use of tris(8-quinolinolato)aluminum etc. is preferred. Like the light emitting layer, the electron injecting and transporting layer may be formed by evaporation or the like.

Where the electron injecting and transporting layer is formed separately as an electron injecting layer and an electron transporting layer, two or more compounds are selected in a proper combination from the compounds commonly used in electron injecting and transporting layers. In this regard, it is preferred to laminate layers in such an order that a layer of a compound having a greater electron affinity may be disposed adjacent the cathode. The order of lamination also applies where a plurality of electron injecting and transporting layers are provided.

As the substrate, a transparent or translucent material such as glass, quartz or resins is used in the construction wherein emitted light exits from the substrate side. The substrate may be provided with a color filter film, a fluorescent material-containing color conversion film or a dielectric reflecting film for controlling the color of light emission. In the case of the reversely stacked construction, the substrate may be either transparent or opaque, and ceramics may be used as the opaque substrate.

The color filter film used herein may be a color filter as used in liquid crystal displays and the like. The properties of a color filter may be adjusted in accordance with the light emission of the organic EL device so as to optimize the extraction efficiency and color purity.

It is also preferred to use a color filter capable of cutting light of short wavelength which is otherwise absorbed by the EL device materials and fluorescence conversion layer, because the light resistance and display contrast of the device are improved.

An optical thin film such as a multilayer dielectric film may be used instead of the color filter.

The fluorescence conversion filter film is to covert the color of light emission by absorbing electroluminescence and allowing the fluorescent material in the film to emit light. It is formed from three components: a binder, a fluorescent material, and a light absorbing material.

The fluorescent material used may basically have a high fluorescent quantum yield and desirably exhibits strong absorption in the electroluminescent wavelength region. In practice, laser dyes are appropriate. Use may be made of rhodamine compounds, perylene compounds, cyanine compounds, phthalocyanine compounds (including subphthalocyanines), naphthalimide compounds, fused ring hydrocarbon compounds, fused heterocyclic compounds, styryl compounds, and coumarin compounds.

The binder is selected from materials which do not cause extinction of fluorescence, preferably those materials which can be finely patterned by photolithography or printing technique. Also, those materials which are not damaged upon deposition of ITO are preferred.

The light absorbing material is used when the light absorption of the fluorescent material is short and may be omitted if unnecessary. The light absorbing material may also be selected from materials which do not cause extinction of fluorescence of the fluorescent material.

In forming the hole injecting and transporting layer, the light emitting layer, and the electron injecting and transporting layer, vacuum evaporation is preferably used because homogeneous thin films are available. By utilizing vacuum evaporation, there is obtained a homogeneous thin film which is amorphous or has a grain size of less than 0.1 $\mu$m. If the grain size is more than 0.1 $\mu$m, uneven light emission would take place and the drive voltage of the device must be increased with a substantial drop of electric charge injection efficiency.

The conditions for vacuum evaporation are not critical although a vacuum of $10^{-4}$ Pa or lower and an evaporation rate of about 0.01 to 1 nm/sec. are preferred. It is preferred to successively form layers in vacuum because the successive formation in vacuum can avoid adsorption of impurities on the interface between the layers, thus ensuring better performance. Also, the drive voltage of a device can be reduced and the development and growth of dark spots be restrained.

In the embodiment wherein the respective layers are formed by vacuum evaporation, where it is desired for a single layer to contain two or more compounds, boats having the compounds received therein are individually temperature controlled to achieve co-deposition.

The organic EL device of the invention is generally of the DC drive type while it can be of the AC or pulse drive type. The applied voltage is generally about 2 to 20 volts

EXAMPLE

Examples of the present invention are given below together with Comparative Examples and by way of illustration.

Example 1

On silicon wafers, AlLi alloy films were deposited to a thickness of 300 nm by a DC sputtering process using an AlLi alloy sample A having a lithium concentration of 4.2 at % and an AlLi alloy sample B having a lithium concentration of 8.0 at % as the target. The sputtering pressure and deposition rate are as shown in Table 1. The sputtering gas used was argon, the input power was 100 watts, the target was sized to a diameter of 4 inches, and the distance between the substrate and the target was 90 mm.

TABLE 1

| Sputtering pressure (Pa) | Deposition rate (nm/min.) | Li concentration Sample A (at %) | Li concentration Sample B (at %) |
|---|---|---|---|
| 0.3 | 10 | 2.4 | 4.7 |
| 1.0 | 8.4 | 3.8 | 7.0 |
| 2.0 | 6.3 | 4.6 | 8.7 |
| 3.0 | 4.9 | 4.9 | 9.3 |
| 4.5 | 3.3 | 5.6 | 10.8 |

The film composition was examined by ICP, with the results shown in Table 1. It is evident from Table 1 that for a single target composition, the lithium concentration of a deposit formed therefrom as an electron injecting electrode can be controlled by varying the sputtering pressure.

Example 2

A glass substrate having a patterned transparent ITO electrode (hole injecting electrode) of 100 nm thick formed by a sputtering process was subjected to ultrasonic washing with neutral detergent, acetone, and ethanol, pulled up from boiling ethanol, dried, surface cleaned with UV/$O_3$, and then secured by a holder in a vacuum evaporation chamber, which was evacuated to a vacuum of $1\times10^{-4}$ Pa or lower. Then, 4,4',4"-tris(N-(3-methylphenyl)-N-phenylamino) triphenylamine (abbreviated as m-MTDATA) was evaporated at a deposition rate of 0.2 nm/sec. to a thickness of 40 nm, forming a hole injecting layer. With the vacuum kept, N,N'-diphenyl-N,N'-m-tolyl-4,4'-diamino-1,1'-biphenyl (abbreviated as TPD) was evaporated at a deposition rate of 0.2 nm/sec. to a thickness of 35 nm, forming a hole transporting layer. With the vacuum kept, Alq3 was evaporated at a deposition rate of 0.2 nm/sec. to a thickness of 50 nm, forming a light emitting/electron injecting and transporting layer. With the vacuum kept, this EL device structure substrate was transferred from the vacuum evaporation chamber to a sputtering apparatus. An AlLi alloy film having a lithium concentration of 7.3 at % was deposited to a thickness of 200 nm by a DC sputtering process using argon as the sputtering gas and an input power of 100 watts. The sputtering pressure was 1.0 Pa, the sputtering gas used was argon, the input power was 100 watts, the target was sized to a diameter of 4 inches, and the distance between the substrate and the target was 90 mm.

When a DC voltage was applied across the thus obtained organic EL device in a dry argon atmosphere, the device produced a maximum luminance of 38,000 cd/$m^2$ at 14 V and 825 mA/$cm^2$. On continuous driving at a constant current density of 10 mA/$cm^2$, the initial luminance was 560 cd/$m^2$ at 6.6 V, the half life of luminance was 650 hours, and the drive voltage rise during the half-life period was 2.1 V. The development and growth of dark spots of a size in excess of 100 $\mu$m was not observed until 200 hours. The results are shown in Table 2 as sample No. 4.

Example 3

Organic EL device samples were fabricated as in Example 2 except that the electron injecting electrode was formed by changing the lithium concentration of the AlLi alloy film deposited in Example 2 to 0.81 at %, 2.2 at %, 5.2 at %, 10.4 at %, and 11.4 at %.

Each sample was continuously driven at a constant current density while the voltage and luminance of light emission were measured. In all the samples, the light emitted was green light (emission maximum wavelength λmax=530 nm). The half-life of luminance, the drive voltage rise during the half-life period, and the time for dark spots of a size in excess of 100 μm to develop and grow were measured. The results are shown in Table 2.

Comparative Example 1

A device was fabricated as in Example 2 except that the electron injecting electrode was formed by vacuum co-evaporation of MgAg (deposition rate ratio 10:1). It was evaluated as in Example 2 to find a maximum luminance of 18,000 cd/m$^2$ at 15 V and 500 mA/cm$^2$. On continuous driving at a constant current density of 10 mA/cm$^2$, the initial luminance was 470 cd/m$^2$ at 6.9 V, the half life of luminance was 400 hours, and the drive voltage rise during the half-life period was 2.6 V. The development and growth of dark spots of a size in excess of 100 μm was observed at 96 hours. The results are shown in Table 2.

Comparative Example 2

A device was fabricated as in Example 2 except that the electron injecting electrode was formed by vacuum co-evaporation of AlLi (lithium concentration 28 at %). It was evaluated as in Example 2. The initial luminance was 470 cd/mm$^2$ at 7.4 V, the half life of luminance was 300 hours, and the drive voltage rise during the half-life period was 3.6 V. The development and growth of dark spots of a size in excess of 100 μm was observed at 48 hours. The results are shown in Table 2.

TABLE 2

| Sample No. | Li conc. (at %) | Continuous drive Voltage (V) | Continuous drive Luminance (cd/mz) | Luminance half-life (hr.) | Voltage rise (V) | Dark spot develop time (hr.) |
|---|---|---|---|---|---|---|
| 1 | 0.81 | 6.9 | 510 | 650 | 1.2 | 200 |
| 2 | 2.2 | 6.8 | 510 | 650 | 1.1 | 250 |
| 3 | 5.2 | 6.6 | 510 | 650 | 1.3 | 250 |
| 4 | 7.3 | 6.6 | 560 | 650 | 1.5 | 250 |
| 5 | 10.4 | 6.6 | 560 | 650 | 2.1 | 200 |
| 6 | 11.4 | 6.6 | 550 | 650 | 2.1 | 200 |
| 7* | MgAg | 6.9 | 470 | 400 | 2.6 | 96 |
| 8* | 28 | 7.4 | 470 | 300 | 3.6 | 48 |

*comparative examples

It is evident from Table 2 that the samples within the scope of the invention are superior to the comparative samples with respect to emission luminance, luminance half-life, voltage rise, and dark spot development.

INDUSTRIAL APPLICABILITY

There have been realized organic EL devices comprising electron injecting electrodes which have good adhesion at the organic layer interface, good electron injection efficiency, and improved light emission characteristics, cause little damage to the organic layer, prohibit the development of dark spots, and experience little loss of performance.

What is claimed is:

1. An organic electroluminescent device comprising a hole injecting electrode, an electron injecting electrode, and at least one organic layer disposed between the electrodes, said electron injecting electrode being comprised of an AlLi alloy containing 0.4 to 14 at % of lithium deposited by a sputtering process.

2. The electroluminescent device of claim 1, wherein said electron injecting electrode comprises an AlLi alloy containing 3.2 to 14 at % Li.

3. The electroluminescent device of claim 2, wherein said electron injecting electrode has a Li concentration which varies in the direction of the electron injecting electrode thickness.

4. The electroluminescent device of claim 3, wherein said electron injecting electrode has a higher concentration of Li at the surface of said electron injecting electrode closest to said organic layer, and a lower Li concentration at the opposite surface of said electron injecting electrode.

5. The organic electroluminescent device according to claim 3, wherein the Li concentration in said electron injecting electrode varies in a stepwise manner in the direction of the electron injecting electrode thickness.

6. The electroluminescent device of claim 1, wherein said electron injecting electrode comprises an AlLi alloy containing 6.5 to 14 at % Li.

7. The organic electroluminescent device according to claim 1, wherein said electron injecting electrode further comprises at least one element selected from the group consisting of Cu, Mg, Zr, Fe, Si, and O in an amount of up to 5 weight % based on the total weight of said electron injecting electrode.

8. The electroluminescent device of claim 1, wherein said electron injecting electrode has a Li concentration which varies in the direction of the electron injecting electrode thickness.

9. The electroluminescent device of claim 8, wherein said electron injecting electrode has a higher concentration of Li at the surface of said electron injecting electrode closest to said organic layer, and a lower Li concentration at the opposite surface of said electron injecting electrode.

10. The organic electroluminescent device according to claim 8, wherein the Li concentration in said electron injecting electrode varies in a stepwise manner in the direction of the electron injecting electrode thickness.

11. A method for preparing an electroluminescent device comprising a hole injecting electrode, an electron injecting electrode, and at least one organic layer disposed between the electrodes, wherein said electron injecting electrode is deposited by a sputtering process using an AlLi alloy as the target and said electron injecting electrode comprises an AlLi alloy containing 0.4 to 14 at % Li.

12. The method according to claim 11, wherein the sputtering gas has a pressure during deposition of said electron injecting electrode in the range of 0.2 to 5 Pa.

13. The method according to claim 11, wherein the sputtering process is a DC sputtering process.

14. The method according to claim 11, wherein the pressure of a sputtering gas is changed during deposition of said electron injecting electrode, thereby forming an electron injecting electrode in which the Li concentration varies in the direction of the electron injecting electrode thickness.

15. The method according to claim 14, wherein said varied Li concentration is higher at the surface of said electron injecting electrode closest to said organic layer, and a higher Al concentration at the opposite surface of said electron injecting electrode.

16. The method according to claim 11, wherein the sputtering process is a pulsed DC sputtering process.

17. The method according to claim 11, wherein the electron injecting electrode comprises an AlLi alloy containing 3.2 to 14 at % Li.

18. The method according to claim 11, wherein the electron injecting electrode comprises an AlLi alloy containing 6.5 to 14 at % Li.

* * * * *